(12) United States Patent
Ortiz et al.

(10) Patent No.: US 7,757,137 B2
(45) Date of Patent: Jul. 13, 2010

(54) METHOD AND APPARATUS FOR ON-THE-FLY MINIMUM POWER STATE TRANSITION

(75) Inventors: Alberto Garcia Ortiz, Seville (ES); Cedric Lichtenau, Boeblingen (DE); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 11/691,856

(22) Filed: Mar. 27, 2007

(65) Prior Publication Data
US 2008/0238494 A1 Oct. 2, 2008

(51) Int. Cl.
*G01R 31/28* (2006.01)

(52) U.S. Cl. .......................... 714/726; 714/15; 714/30; 714/34; 714/708; 714/727; 714/729

(58) Field of Classification Search ........................ None
See application file for complete search history.

(56) References Cited

U.S. PATENT DOCUMENTS

| | | | |
|---|---|---|---|
| 5,444,404 A | | 8/1995 | Ebzery |
| 6,954,886 B2 * | | 10/2005 | Tu et al. ...................... 714/726 |
| 7,100,144 B2 * | | 8/2006 | Jacobson et al. .............. 716/18 |
| 7,469,372 B2 * | | 12/2008 | Nardini et al. ............... 714/726 |
| 2004/0085121 A1 * | | 5/2004 | Bittlestone et al. .......... 327/544 |
| 2005/0050416 A1 * | | 3/2005 | Hossain ...................... 714/726 |
| 2005/0149799 A1 * | | 7/2005 | Hemia et al. ................. 714/726 |
| 2006/0107144 A1 * | | 5/2006 | Saxena et al. ................ 714/726 |
| 2007/0241811 A1 * | | 10/2007 | Marshall et al. ............. 327/566 |

OTHER PUBLICATIONS

"Leakage Current Reduction in Sequential Circuits by Modifying the Scan Chains", Abdollahi et al., IEEE 4th International Symposium, 2003.*

Abdollahi, et al., "Leakage Current Reduction in CMOS VLSI Circuits by Input Vector Control", IEEE Transactions on Very Large Scale Integration (VLSI) Systems, vol. 12, No. 2, Feb. 2004, pp. 140-154.

(Continued)

*Primary Examiner*—John P Trimmings
(74) *Attorney, Agent, or Firm*—Scully, Scott, Murphy & Presser, P.C.; Michael J. LeStrange, Esq.

(57) ABSTRACT

The invention includes a novel scan chain structure for LSSD or GSD IC operation. The scan chain structure includes a first flip-flop (L1) and a second flip-flop (L2) configured to operate the first flip-flop (L1) in normal mode operation, in scan mode operation, in initialization mode and in low leakage power mode operation, wherein each flip-flop within a long scan chain of latches includes a data input, data output, a clock input, a scan-in input and a scan-out output, arranged for normal mode operation. A buffer circuit is electrically connected between the scan-out output of the second flip-flop (L2) and the scan-in input of the first flip-flop (L1) for the next latch in the scan chain, the buffer circuit including a control element that controls the operation the first flip-flop (L1) to scan mode or low power leakage mode. The first flip-flop (L1) is set to a data output value upon exit from low power leakage mode that is the same value that it is set to at initialization during normal mode operation. The switching occurs in only one clock cycle.

7 Claims, 2 Drawing Sheets

OTHER PUBLICATIONS

Rao, et al., "A Heuristic to Determine Low Leakage Sleep State Vectors for CMOS Combinational Circuits", ICCAD'03, Nov. 11-13, 2003, San Jose, California, USA, ACM 1-58113-762-1/03/0011; pp. 689-692.

Abdollahi, et al., "Leakage Current Reduction in Sequential Circuits by Modifying the Scan Chains", Proceedings of the Fourth International Symposium on Quality Electronic Design (ISQED'03), 0-7695-1881-8/03, 2003 IEEE Computer Society.

Rohrer, et al., "PowerPC 970 in 130nm and 90nm Technologies", pp. 68-69, ISSCS 2004.

Sylvester, et al., "Future Performance Challenges in Nanometer Design", DAC 2001, Jun. 18-22, 2001, Las Vegas, Nevada, USA; ACM 1-58113-297-2/01/0006, pp. 3-8.

Chopra, et al., "Implicit Pseudo Boolean Enumeration Algorithms for Input Vector Control", DAC 2004, Jun. 7-11, 2004, San Diego, California, USA, ACM 1-58113-828-8/04/0006, pp. 767-772.

* cited by examiner

METHOD AND APPARATUS FOR ON-THE-FLY MINIMUM POWER STATE TRANSITION

BACKGROUND OF THE INVENTION

The present invention relates to improved power leakage control in very large scale integrated (VLSI) circuits, and more particularly relates to an improved input vector control (IVC) approach in a scan-based VLSI design that utilizes scan-chain logic to set sleep mode and reset the flip flops from a low-power state with the same logical values that the flip-flops were set to at initialization.

Leakage power consumption is becoming an increasing problem for semiconductor designers as they pack larger amounts of transistors onto a single semiconductor integrated circuit (IC) or chip comprising a very large scale integrated (VLSI) circuit design. VLSI designs, e.g., a microprocessor, display significant static power consumption through internal current leakage with three main sources. The two main sources include: gate direct tunneling leakage and sub-threshold leakage through the channel of an "off" transistor. One example where the toll in power consumption by this static leakage is readily apparent is in microprocessors where more than 30% of the total power consumed during normal operation is due to leakage. When operating in its low power mode with voltage and frequency scaling, the ratio between leakage power and total power can be as large as 50%.

This and related power leakage problems in VLSI processors are discussed in detail in a paper by Rohrer, et al., POWERPC 970 IN 130 NM AND 90 NM TECHNOLOGY, Pages 68-69, ISSCS 2004. Power leakage reduction in VLSI processors is not just an issue for operation and performance, but in manufacturing as well. For example, DAC's publication FUTURE PERFORMANCE CHALLENGES IN NANOMETER DESIGN, pages 3-8, DAC 2001, reports that a reduction of 10 W in the power consumption of the Intel Pentium microprocessor is known to realize a decrease in packaging cost by more than three. For that matter, leakage power consumption for normal operation causes a secondary power consumption in energy to cool the IC as a consequence. If not cooled, increased temperature conditions can degrade IC performance and reliability.

Consequently, various processes and techniques have developed for reducing power dissipation, whether by attempting to reduce static leakage current or prevent unnecessary switching, to name two. For example, in a paper by Abdollahi, et al., LEAKAGE CURRENT REDUCTION IN CMOS VLSI CIRCUITS BY INPUT VECTOR CONTROL (IVC), vol. 12, IEEE Trans. On VLSI Systems (No. 2, February 2004), the authors provide some promising insight on power reduction using input vector control (IVC) processes and suggested improvements. IVC techniques introduce sleep transistors into the VLSI design to mitigate increased leakage current. Other work concerning IVC designs includes Rao, et al., A HEURISTIC TO DETERMINE LOW LEAKAGE SLEEP STATE VECTORS FOR CMOS COMBINATIONAL CIRCUITS, pages 689-692, ICCAD 2003, and Chopra, et al., IMPLICIT PSEUDO BOOLEAN ENUMERATION ALGORITHMS FOR INPUT VECTOR CONTROL, pages 767-772, DAC 2004 (Jun. 7-11, 2004). The cited references appear to agree that leakage power consumption within an IC device depends strongly on the state of the IC device input and of the internal memory elements (e.g. latches), which affects switching and leakage significantly.

Input Vector Control (IVC) techniques exploit the property that controlling input state can reduce chip-wide power consumption, as discussed in the referenced papers, and in U.S. Pat. No. 7,100,144 to Jacobson et al., commonly owned and incorporated by reference herein, In scan-based VLSI designs, flip-flops are connected to enable two modes of operation: normal mode and test mode. The inputs are multiplexed to operate both modes separately. During test, a test vector is applied in scan mode; the sequential or combinatorial logical circuit state outputs are captured in the flip-flops as configured in normal operational mode. This operation is modified to place the same logical circuits in stand-by or sleep mode. That is, during sleep mode, the device inputs are forced to a state in which power consumption due to leakage is minimal using the IVC concept. Abdollahi asserts that attainable static power reductions that approach 25% are readily achievable using their method, which is substantial.

The processes discussed by Abdollahi and Chopra include inserting a multiplexer at particular nodes in IC designs and using IVC to stimulate the combinational logic to the desired low leakage state. The multiplexer is controlled with a sleep signal for compelling the gates to their low-leakage state. During normal operational mode, the multiplexer selects the original signal directed as the circuit input, and passes it to the logic gate(s). When in sleep mode, a signal that defines a low-leakage output state (derived from the IVC vector) is provided to the logical gate input. Abdollahi proposes refining the process by reducing the multiplexer to simpler gates. The Abdollahi approach, however, has its drawbacks. For example, the suggested approach introduces additional logic in the critical circuit or logic paths, which degrades or slows timing. In addition, Abdollahi's approach requires a global sleep signal with a very large fan-in/fan-out. This results in a large routing overhead in the original circuit floorplan, where the fan-out tree itself consumes significant static and dynamic power each time the additional logic path sets and resets the sleep mode.

Abdollahi suggests a second related technique wherein a third latch is added to the two traditional latches comprising a conventional master-slave flip-flops, which are used globally throughout the VLSI circuit for signal throughput. The use of the third latch provides a means for forcing and restoring the state of the flip-flops during sleep mode operation. Besides adding the third latch, sleep control logic and multiplexer logic similar to the combinational logic must be included to accomplish the control. Hence, the second Abdollahi technique also imposes large area overhead, limiting the benefit for their stated purpose. More, the second technique may impose other global sleep mode complications in the ICs or IC processors within which they would be implemented.

Abdollahi also suggest a scan chain approach, which uses a scan path design to shift the logical circuits or gates to a low leakage state. In its simplest form, the Abdollahi scan chain approach requires an additional memory equivalent in size with the scan chain to restore the values of the latch circuits to their operational state, resetting them from sleep mode. That is, by controlling only the master latch (L1) part of the flip-flop, Abdollahi suggest that it is possible to employ the scan path to set the latch circuit output to a low leakage state. Such an approach includes an area overhead for at least the memory, and may counteract any improvement in stemming current leakage that could be realized.

German Patent Application No. DE 920050016US1 to T. Gemmeke, commonly owned and incorporated by reference herein, suggests an IVC-based approach that includes modifying the feedback loop of a master slave flip-flop to allow asynchronous controllability of the slave. The approach is unique, and appears promising but for the fact that its implementation would require a modification of standard latch technology design. That is, implementing such an approach in an existing IC or processor design would require modifying flip-flop design globally, and would therefore be disruptive in the design's manufacturing process. Required redesign would be likely to negatively impact project scheduling when the modified flip-flops are incorporated into existing designs. Moreover, the new proposed flip-flops would be inherently slower because of the third latch, so that overall timing during normal operational mode would be adversely affected, further complicating redesign efforts.

What would be desirable, therefore, in the field of VLSI circuit design and manufacture, is an improved IVC-based design and operation, which does not result in timing degradation in critical IC pathways, particularly for microprocessors, but realizes lowered global power dissipation throughout the IC or IC processor. The benefits should also minimize additional logic circuits and area overhead should realize lower power consumption during sleep mode operation that is, during set and reset, and should not affect conventional design and manufacturing flow.

SUMMARY OF THE INVENTION

To that end, the present invention provides a novel improved input vector control (IVC) approach that may be referred to as "on-the-fly minimum power transition." The novel "on-the-fly minimal power transition" method takes advantage of the fact that large portions of microprocessor logic is comprised of pipelines and quiescent functional units that need not be restored to their pre-sleep mode state when exiting from low power or sleep mode states. In many cases, it is sufficient to reset latches with the same logical values that the flip-flops are set to at initialization. Hence, the inventive structure and method takes advantage of existing logic circuits for initialization. This invention inserts an IVC circuit in IC scan path to apply the input vector to be set for IVC in just one cycle. The IVC circuit also allows to exit sleep mode and reinitialize the latch in one additional cycle. This reduces the power consumption required to enter and exit the sleep mode. The area overhead for implementing the novel sleep mode operation is minimal as well.

The inventive structure and associated VLSI designs shows no timing degradation in the critical paths as found in prior art attempts to minimize power loss using IVC schemes. The inventive structure may be seamlessly integrated in standard design flows. That is, the benefit of using the novel structure and method in VLSI design realizes a resulting reduction in the dynamic power consumption of the scan chains (i.e., switching power is eliminated during functional operation), and a fast transition in/out of the low leakage state. Fast transition in and out of leakage state realizes marked decrease in consumed power due to minimized latch toggling. And as known, for testability reasons, the scan paths cover almost every latch in a microprocessor design. Thus, during normal operational mode, there is minimal unnecessary toggling or switching, and less global power dissipation throughout the IC therefore.

BRIEF DESCRIPTION OF THE DRAWING FIGURES

FIG. 1 is a circuit diagram of a conventional scan chain, and the novel scan chain of this invention that highlights replacement of a simple inverter in a conventional scan chain with a novel IVC force cell of the invention;

FIGS. 2a, 2b, 2c and 2d identify four (4) types of the IVC force cells as seen in FIG. 1;

DETAILED DESCRIPTION OF THE INVENTION

Figure 1:
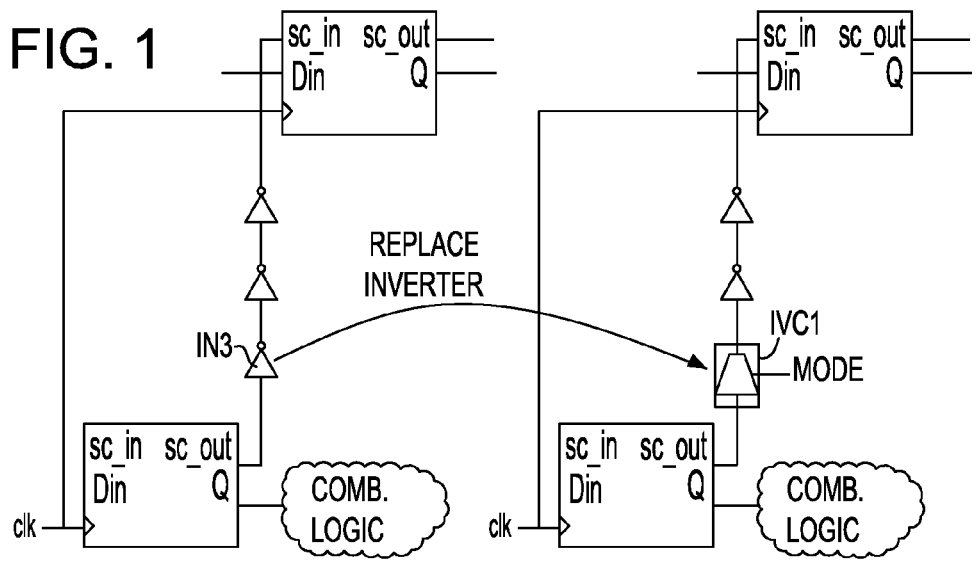

At initialization, many conventional VLSI designs, i.e., microprocessors, do not initialize their flip-flops with a global reset, which would require routing a global signal and consequential degrading of the flip-flop timing. Such conventional designs instead use the scan-path to force an initial value at flip-flops, such as that design disclosed in commonly owned U.S. Pat. No. 7,100,144. Hence, in order to reset N latches, the conventional scan-path approaches require circa N clock cycles. The drawback is that where N is very large (which it is in many typical VLSI microprocessor designs), initialization time becomes critical, particularly in certain applications (e.g., Telco market, real time applications, etc).

The inventive method and VLSI scan chain structure disclosed herein provide for an improved level sensitive scan design (LSSD) or scan-path approach. The novel approach may be described broadly as "on-the-fly minimum power transition". The "on-the-fly minimum power transition" implements a novel IVC-controlled sleep mode operation, and is readily applicable to general scan designs (GSD). When exiting sleep mode, large portions of IC logic comprising pipelines and quiescent functional units may be reset, regardless of their operational state at the time they entered sleep mode, rather than restoring to their pre-sleep states as in known prior art techniques. This obviates the need to store the pre-sleep states or logical values that the flip-flops were logically set to.

Put another way, the inventive structure utilizes the settings that are normally used for initialization to reset the flip-flops when exiting sleep mode, taking advantage of the redundancy of the existing initialization logic circuits that are typical in the multiplexer-based VLSI processors of the prior art. This results in a sleep mode operation with little or no timing degradation in microprocessor's critical pathways as logic is only added to the scan path that is usually run at a lower frequency, and minimal additional logic and area overhead for its implementation in ICs constructed based on the invention. The inventive displays desirable low power consumption and single cycle transition time when entering and exiting the low power or sleep mode, and maintains seamless integration in standard or legacy design flow when incorporated.

As mentioned, the significant core principle in the novel IC design and operation lies in its use of the intrinsic redundancy of the structure that is already included in any such LSSD or GSD based VLSI processor. During operation, the IC that includes the novel scan chain with the novel IVC circuit and functioning conducts a scan-mode operation, an initialization operation, or a low-power IVC operation. By its novel force cell-based scan chain structure and operation, the inventive LSSD IC design creates and uses separate system and scan clocks to distinguish between normal and test (scan) modes. Latches are used in pairs, where each has a normal data input, data output and clock for normal operational mode. For test mode operation, the two latches form a master-slave pair with one scan input, one scan output and non-overlapping scan clock held low during normal system operation. Scan data is latched when the latches are pulsed high for the testing or normal scan-path operation. To enter sleep mode, the mode pin is held high and the scan clock is pulsed once. When exiting sleep mode, the IC latches are merely reinitialized by pulsing the scan clock again while holding the mode pin low.

To implement the invention in normal scan chain circuitry, one inverter in the latch scan chain logic is replaced with a logical circuit referred to herein as an "IVC force cell." FIG. 1 depicts the essence of the inventive modification to a prior art scan chain (the left-hand side of FIG. 1), highlighting inventive replacement of an inverter IN3 with a special IVC force cell, or IVC1, in the right-hand side of FIG. 1. For that matter, FIGS. 2a, 2b, 2c and 2d identify four (4) types of the IVC force cells as seen in FIG. 1. Each IVC force cell includes a data input "a," a mode control input "mode," and a data output "y."

Figure 2A:
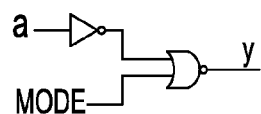
Figure 2B:
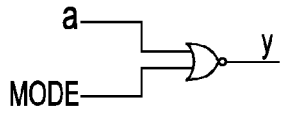
Figure 2C:
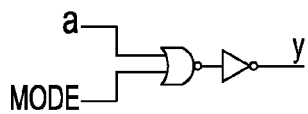
Figure 2D:
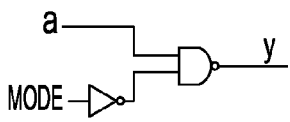
Figure 3:
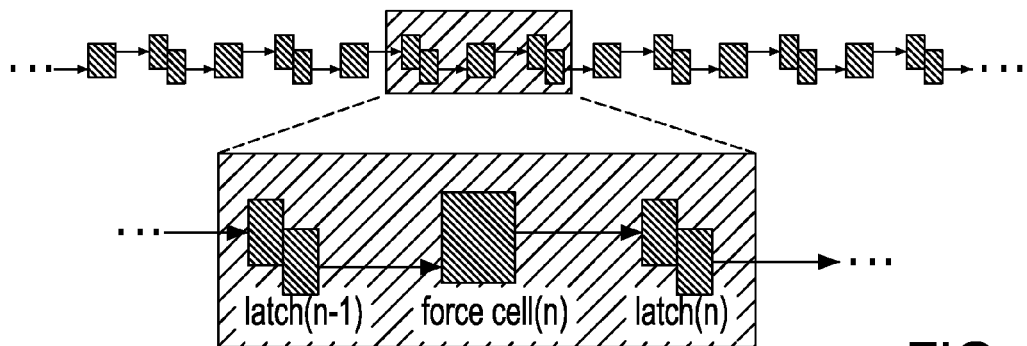
FIG. 3 depicts a scan chain within which is inserted an IVC circuit of this invention.

The IVC force cells of FIGS. 2a and 2c are for non-inverting logical requirements, where the FIGS. 2b and 2d cells are for inverting logical requirements. The IVC force cells designated as "Force 0" in FIGS. 2a-d indicate the need to force a 0 during sleep mode. When using a "Force 1" block, the IVC force cells hold the scan-out signal to a fixed value of 1, preventing switching. That is, of the first row (FIGS. 2a and 2b) are used to force the next latch in the scan path to 0 when entering sleep mode. The force cell depicted in 2a is used if the initialization value for this latch is 0 and the sleep mode value for the previous latch in the scan path is also 0 else the force cell depicted in 2b is used, Similarly the force cells shown in FIGS. 2c and 2d are used if the latch should be forced to a 1 during sleep mode. The arrangement of the inventive logical circuitry may be inserted with scan paths as shown in FIG. 3.

Figure 4:
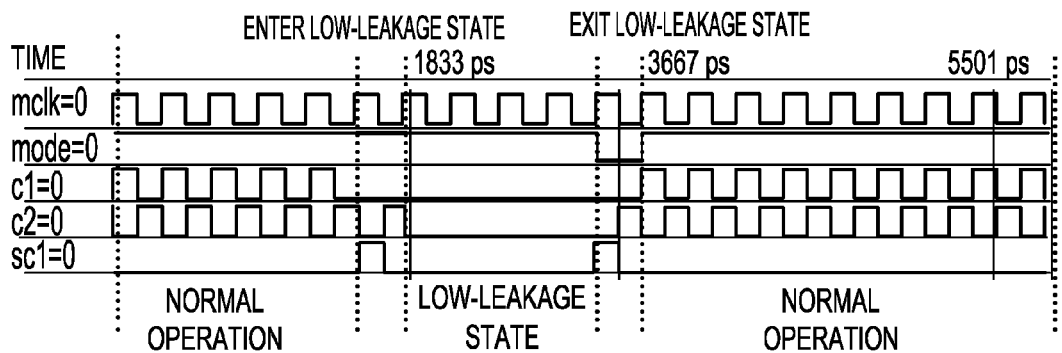
FIG. 4 depicts a set of timing diagrams that identify the timing of the present inventive scan chain during normal, low-leakage state and the transition back to normal operations.

By selecting the appropriate IVC force cell for each latch of an IC allows for the novel IVC-based sleep mode operation, initialization operation, scan-mode operation and normal operation to be supported. FIG. 4 shows the timing during normal operation where the IC is constructed to include "on-the-fly minimum power transition" using the novel IVC force cells. When the IVC control sets the mode signal to a "1", a fixed value is held in the scan path equal to a Low-Leakage-Vector (the IVC vector), that is, set into the flip-flops by the test clock (mode=1). A pulse on the test clock initiated by the IVC control latches the Low-Leakage-Vector into the flip-flops. No additional signal must be toggled to conduct the sleep mode operation. When exiting sleep mode to return back into normal (reset) operation mode (mode=0), the mode input is set to 0, and a pulse in the test clock is provided to clock the initialization value into the flip-flop. The innovative IVC circuit and the state of the previous latch in the scan path combined with the inverters within the scan path generate the initialization state to which the flip-flops are set in one cycle of operation. Again, during sleep mode (mode=1), the scan paths are fixed with constant values that prevent toggling, when in normal scan mode (mode=0) the scan paths are connected for normal test operation. The following table summarizes the logical implementation of the input vector control using various force_cell(n) as shown.

| latch(n) sleep value | latch(n − 1) sleep value | desired latch(n) init value | force_cell(n) required |
|---|---|---|---|
| 0 | 0 | 0 | force0_noinvert |
| 0 | 1 | 0 | force0_invert |
| 1 | 0 | 0 | force1_noinvert |

-continued

| latch(n) sleep value | latch(n − 1) sleep value | desired latch(n) init value | force_cell(n) required |
|---|---|---|---|
| 1 | 1 | 0 | force1_invert |
| 0 | 0 | 1 | force0_invert |
| 0 | 1 | 1 | force0_noinvert |
| 1 | 0 | 1 | force1_invert |
| 1 | 1 | 1 | force1_noinvert |

Implementing the invention in a microprocessor design makes possible the low power operation with global IC power savings of up to 25%. To summarize the benefits, entering and exiting the sleep mode is achieved by the toggling of just one signal instead of the traditional two or three suffices to carry out scanning, reducing power overhead for entering a low-leakage state. Furthermore the sleep state is entered and exited in just one clock cycle instead of many cycles normally required to scan the whole scan ring. Accordingly, additional routing (and capacitance) required by the novel modification is very small. And the mode signal used to control the IVC-force cells may be recycled from the block dedicated to the local clock generation, removing or obviating the need for additional global signal routing. This local change requires negligible additional wires and congestion therefrom, and very localized and small logical changes to existing designs.

While the proposed technique does not recover the states of the flip-flops after exiting the low power state, the inventive design shows marked improvement nevertheless with respect to conventional operation because large parts of the logic in conventional microprocessors do not require being reset back to their pre-sleep state during normal operation. The invention may therefore be implemented in many pipelines and quiescent processor/functional units at little or no cost no cost, and require only two clock cycles to enter and exit the low leakage mode.

Figure 5:
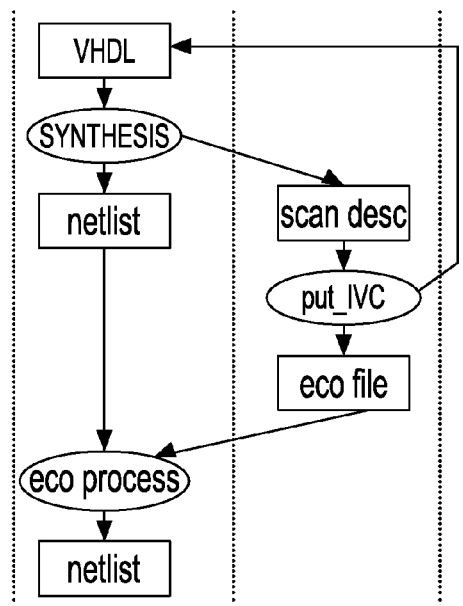
FIG. 5 depicts a flow diagram that depicts the processing flow for implementing the present invention in a VLSI design process.

Again, implementation of the inventive IVC circuitry within a conventional scan-based design results in a drastic improvement over conventional initialization techniques which may require hundred of cycles to scan the whole latch chain. In the last stages of an IC design process, a standard ECO (Engineering Change Order) process could be used to implement the "On-the-fly Minimum Power Transition". During the process or change operation, a prototype tool or process may employ the scan chain information provided during the RTL synthesis to determine which IVC-force cells to insert, and where the IVC-force cells should be inserted. The outputs of that tool are an ECO file, and a VHDL patch. The first is used to update the logic design netlist, while the second updates the VHDL for logic consistency, as may be seen in FIG. 5.

Although a few examples of the present invention have been shown and described, it would be appreciated by those skilled in the art that changes may be made in these embodiments without departing from the principles and spirit of the invention, the scope of which is defined in the claims and their equivalents.

The invention claimed is:

1. A scan-chain for use in LSSD or GSD-based VLSI circuit designs, the scan chain comprising:
   at least two flip-flops configured to operate in normal mode operation, in scan mode operation and in low leakage power mode operation, where each flip-flop includes a data input a data output, a clock input, a scan-in input and a scan-out output; and a input vector control (IVC) circuit electrically connected between the scan-out output of one of the at least two of flip-flops and the scan-in input of a next flip-flop within a scan chain, the IVC circuit comprising:

a mode control element to receive the scan-out output of one of the at least two flip-flops and forcing said scan-out output in one of normal mode, low power leakage mode and initialization mode, wherein the one flip-flop scan-out output is set to a data output value upon exit from low power leakage mode that is equivalent to the flip-flop is set to at initialization during normal mode operation.

2. The scan chain as set forth in claim 1, wherein the mode control element controls a first flip-flop (L1) to one of low leakage power mode, normal mode operation and initialization mode using a mode control signal normally used for scan mode operation.

3. The scan chain as set forth in claim 2, wherein the mode control element compels the first flip-flop (L1) to operate in normal mode in the presence of an inactive mode select signal and in low leakage power mode when the mode select signal is active.

4. The scan chain as set forth in claim 3, wherein the mode control element comprises one of:

a dual-input logical NOR element electrically connected at its output to an inverter; and an inverter electrically connected at its output to an input of a dual-input logical NOR element.

5. The scan chain as set forth in claim 3, wherein the mode control element comprises one of:

a dual input logical NOR element; and an inverter electrically connected to an input of a dual-input logical NAND element.

6. A LSSD or GSD-based integrated circuit constructed for IVC-based sleep mode, scan-mode, initialization mode and normal operation, which comprises a scan chain that comprises:

a first flip-flop (L1) and a second flip-flop (L2) configured to operate the first flip-flop (L1) in normal mode operation, in scan mode operation, in initialization mode and in low leakage power mode operation, wherein each flip-flop includes a data input, data output, a clock input, a scan-in input and a scan-out output; and a buffer circuit electrically connected between the scan-out output of the second flip-flop (L2) and the scan-in input of the first flip-flop (L1) in the next latch within the scan chain, the buffer circuit including a control element that controls the operation of the first flip-flop (L1) in scan mode or low power leakage mode;

wherein the first flip-flop (L1) is set to a data output value upon exit from low power leakage mode that is the same value that it is set to at initialization during normal mode operation during only one clock cycle.

7. A scan-chain comprising a plurality of latches for use in LSSD or GSD-based VLSI circuit designs, and includes a input vector control (IVC) circuit disposed with the scan chain constructed to scan and control the latches to one of two predefined latch states, comprising:

a plurality of flip-flops arranged to operate in normal mode operation, in scan mode operation and in low leakage power mode operation, wherein each flip-flop includes a data input, data output, a clock input, a scan-in input and a scan-out output, arranged for normal operation; and the IVC circuit, wherein the IVC circuit comprises:

an IVC_force cell electrically inserted into the scan chain between the scan-out output of one flip-flop and the scan-in input of a next flip-flop within the chain, and including a mode control input to control scan-chain flip-flop operation in scan mode, low power leakage mode or initialization mode so that upon exit from low power leakage mode, the flip-flops are set to data output values that are equivalent to the scan chain initialization values.

* * * * *